(12) United States Patent
Dessiatoun

(10) Patent No.: US 7,571,618 B2
(45) Date of Patent: Aug. 11, 2009

(54) COMPACT HEAT EXCHANGING DEVICE BASED ON MICROFABRICATED HEAT TRANSFER SURFACES

(75) Inventor: Serguei V. Dessiatoun, Colmar Manor, MD (US)

(73) Assignee: University of Maryland, College Park, MD (US)

( * ) Notice: Subject to any disclaimer, the term of this patent is extended or adjusted under 35 U.S.C. 154(b) by 320 days.

(21) Appl. No.: 11/430,154

(22) Filed: May 9, 2006

(65) Prior Publication Data
US 2006/0289662 A1 Dec. 28, 2006

Related U.S. Application Data

(60) Provisional application No. 60/679,477, filed on May 10, 2005, provisional application No. 60/686,901, filed on Jun. 2, 2005.

(51) Int. Cl.
*F25D 23/12* (2006.01)
(52) U.S. Cl. ...................................... 62/259.2; 165/80.1
(58) Field of Classification Search ................... 62/3.3, 62/259.2; 165/80.1, 80.2, 80.3; 361/688
See application file for complete search history.

(56) References Cited

U.S. PATENT DOCUMENTS

| 4,446,851 | A | 5/1984 | Grose |
| 5,205,353 | A | 4/1993 | Willemsen et al. |
| 6,230,408 | B1 | 5/2001 | Elufeld et al. |
| 6,889,758 | B2 | 5/2005 | Burgers et al. |
| 6,935,410 | B2 * | 8/2005 | Lee et al. ................... 165/80.3 |
| 6,994,155 | B2 * | 2/2006 | Dessiatoun et al. ......... 165/165 |
| 2002/0125001 | A1 | 9/2002 | Kelly et al. |

OTHER PUBLICATIONS

Harpole, et al; "Micro-channel heat exchanger optimization"; Semiconductor Thermal Measurement and Management Symposium, 1991; Semi-Therm VII. Proceedings., Seventh Annual IEEE; Feb. 12-14, 1991; pp. 59-63.

* cited by examiner

*Primary Examiner*—Melvin Jones
(74) *Attorney, Agent, or Firm*—Rosenberg, Klein & Lee

(57) ABSTRACT

A lightweight compact self-contained microchannel heat exchanger includes a multi-sided heat transfer member having an array of parallel microgrooves (or rows of micropins) on each of the side, and positioned in thermal contact with the heat generating object to be cooled. A fluid distribution unit having a developed system of feed channels and exhaust channels is mounted to the micropatterned surface for guiding an incoming cold working fluid to remove heat from the microgrooves (or micropins). The heat exchanging device includes in one embodiment a pair of double-sided heat transfer plates having an array of microgrooves extending on each of its opposed surfaces, the fluid distribution unit being sandwiched between the double-sided heat transfer plates. The heat transfer plates and distribution units may be stacked to form a multi-layered cooling system with improved pressure drop and increased heat transfer efficiency. The device may be used in several modes of operation such as single phase convection, thin film evaporation, and forced-feed boiling, and may operate with or without a pump depending on heat transfer requirements.

13 Claims, 11 Drawing Sheets

COMPACT HEAT EXCHANGING DEVICE BASED ON MICROFABRICATED HEAT TRANSFER SURFACES

This Utility Patent Application is based on Provisional Patent Applications No. 60/679,477 filed 10 May 2005 and No. 60/686,901 filed 2 Jun. 2005.

FIELD OF THE INVENTION

The present invention is directed to a system for thermal management of heat generating objects, and in particular, to a self-contained heat exchanging system for removing heat in a wide range of high flux electronics applications.

More in particular, the present invention is directed to a heat absorbing system which includes a microgrooved heat transfer plate in thermal contact with a heat generating object and a fluid distributing unit attached thereto and having a system of channeling to supply a working fluid to the microgrooves and to remove the heat in a highly effective fashion.

The present invention further is directed to a heat exchanging system which is capable of working in several modes of operation including single-phase convection, thin film operation, forced-fed boiling and condensation. For thin film operation and forced-fed boiling, the heat exchanging system employs a pump to generate a required pumping pressure for a given heat exchanging medium (working fluid) to enter the heat exchanging system.

The present invention is also directed to a heat exchanging system which may include a plurality of double-sided microgrooved heat exchangers with a fluid distribution unit sandwiched therebetween. An array of parallel microgrooves is formed at each side of the heat exchangers. The microgrooves on different sides of the heat exchangers may extend in parallel each to the other or at any suitable angle ranging from approximately 0 to 90 degrees.

The present invention is further directed to a heat exchanging system having a three-dimensional heat transfer member formed with a plurality of microgrooved surfaces. A fluid distribution unit may be mounted at each of the microgrooved surfaces to form a three-dimensional heat exchanging system capable of highly effective heat removal.

The present invention is furthermore directed to a self-contained hermetical heat exchanger system modularly attached to a source of heat in stackable arrangement with other heat exchanger system modules, each system module including a heat exchanging surface microfabricated with an array of parallel microgrooves (or rows of micropins) formed thereon, and a fluid distribution unit having channels allowing optimized access for the working fluid to the microgrooves (micropins) and easy removal of the working fluid in its heated phase therefrom.

BACKGROUND OF THE INVENTION

Compact heat exchangers with the hydraulic diameter of the channels in the mm range dominate the high tech industry and are gradually winning the majority of the consumer market due to their high heat transfer area-to-volume and heat transfer area-to-mass ratios. Following the requirements of the market, manufacturers of the compact heat exchangers have sought to reduce the production costs of such heat exchangers to make them comparable in cost to conventional shell-and tube or tube-and-fin type heat exchangers.

New developments in microfabrication and in fluid cleaning, stimulated by electronic development, have made possible the fabrication of heat exchangers with micron sized channels. Such technological advancement potentially allows fabrication of heat exchangers with significantly increased (by orders of magnitude) heat transfer area-to-volume and-mass ratios.

Microchannel techniques have demonstrated superior performance in heat transfer over other technologies. Their compactness and extremely high heat transfer area-to-volume ratios make them a desirable component of heat exchanging systems. Typical heat transfer area-to-volume ratios are higher than those of other geometries for heat exchangers or sinks used in electronics. The fluid handling techniques developed in electronics cooling have made the application of microchannels in heat sinks and heat exchangers possible and desirable for many industries.

New developments in microfabrication technology have also made the fabrication of microchannels relatively inexpensive. A microdeformation technology marketed by Wolverine Tube, Inc., for example, offers the fabrication of microchannels with dimensions up to 2-3 micrometers in width in a wide range of materials, thus making microchannels affordable for a wide range of applications. However, attempts to combine new technology with conventional design thus far have resulted in heat exchangers which are either too expensive or characterized by unsatisfactory performance parameters. Particularly, in many such microfabricated heat exchangers are found lacking in pressure drop and pumping power characteristics.

The application of microfabricated surfaces for manufacturing heat pipes and capillary loops serves to optimize the operative structure of heat pipes. Known heat pipes and capillary pump loops are disadvantageously two-dimensional. Most are fabricated on a single wafer with a cover, where the liquid and wafer channels as well as the capillary structure are located on the same plane. Capillary channels extend along the same plane in continuous length, thus causing a substantial pressure drop as liquid passes therethrough. This tends to limit the capacity of the capillary loops.

Known types of two-phase heat transfer device operation include, pool boiling, convection boiling, and capillary loop operation. Pool boiling relies mostly on surface tension in supplying liquid to a super heated boiling surface. A narrow boiling channel provides higher surface tension and promotes operation at higher heat flux. However, a higher pressure drop imposed on liquid flow in the given channels limits liquid supply. This makes it practically impossible to provide an optimum relationship between the channel's hydraulic diameter and length, given conventional arrangements for the pool boiling surface.

Convection boiling operation usually occurs in channels of substantially constant geometry. An external force (generated by a pump, for instance) is applied to the fluid in order to move it through the channels. Both phases of the fluid (the cooling medium), e.g. liquid and vapor, move along the channels together. The lengths of the channels are typically several times greater than their hydraulic diameters. With smaller channels (in sub-millimeter range, for example) which tend to provide the most efficient heat transfer, the required external force as well as the required fluid circulation pumping power may be quite high in magnitude.

Capillary loop operation is used in heat pipes and capillary pump loops. Similar to pool boiling, capillary loop operation relies also on capillary forces to supply liquid to the operative surface. The liquid transport distance is typically higher than in pool boiling; therefore, greater capillary force and smaller capillary dimensions are required. Also similar to a pool boiling, the amount of the supplied cooling medium is limited by pressure drop in the capillary structure. Conventional technologies for fabrication of heat pipes and capillary pump loops do not permit the optimization of the relationship between a capillary's hydraulic diameter and length.

There remains a need for a lightweight compact microchannel based heat exchangers having high heat transfer performance with low pressure drop and low manufacturing costs.

SUMMARY OF THE INVENTION

It is therefore an object of the present invention to provide a heat exchanging structure having high heat transfer performance and low pressure drop applicable in a wide range of applications where cooling of a heat generating surface is needed.

It is a further object of the present invention to provide lightweight, compact microchannel based heat exchangers inexpensive in manufacture, and highly efficient in use, which may be fabricated in modular stackable fashion.

It is still an object of the present invention to provide a miniature heat exchanger wherein decreased pressure drop is attained by arranging short microchannels in parallel to yield small active lengths for individual microchannels yet increased overall area of the fluid paths formed through the microchanneled structure.

It is a further object of the present invention to provide a microchannel based heat exchanger using a double sided microgrooved heat transfer surface with an effective fluid distribution system mounted thereto. The heat exchanger may include a pair of double-sided microgrooved heat transfer surfaces and the fluid distribution unit sandwiched therebetween wherein fluid feed channels, as well as output channels are formed in the fluid distribution unit to permit the cooling fluid to reach the microgrooves of the heat transfer surface and to remove heat therefrom.

It is still an object of the present invention to provide a multi-sided microgrooved heat transfer member with fluid distribution units attached to each microgrooved surface thereby forming a three dimensional heat exchanging structure mounted to a heat generating object in thermal contact therewith.

It is another object of the present invention to provide a microchannel based heat exchanger capable of at least three modes of operation, including single-phase convection, thin film operation, and forced heat boiling.

It is a further object of the present invention to provide a microchannel based heat exchanging system comprising a plurality of heat exchanging modules mounted in thermal contact with heat generating surfaces, a microchannel condenser coupled to outputs of the heat exchanging modules, and a pump coupled between the output of the microchannel condenser and inputs of the microchannel based heat exchanging modules to form a force fed boiling/evaporative system. The pumping pressure is controllable to operate the heat exchanger either in a single-phase convection mode, thin film operation mode, or force-feed boiling mode, depending on the requirements of the particular application.

It is another object of the present invention to provide a heat exchanging miniature device in modular implementation which includes a microgrooved heat transfer surface, with a fluid distributing unit attached to the heat transfer surface that includes a system of heat channels and open areas for vapor circulation. Liquid/vapor movement is optimized and the pressure drop in the microchannels is compensated to thereby increase dissipating heat flux. Short channel lengths provide low pressure drop and optimize the pumping power realized therethrough, so as to optimize capillary structure geometry. Such device may operate in passive capillary mode without employing a pump, or with an external source of pressure such as the pump to operate at much higher heat flux.

A heat exchanging device formed in accordance with one preferred embodiment comprises a heat transfer member (plate) having an array of microgrooves (or micropins) formed at one or several surfaces thereof, and positioned in thermal contact with a heat generating object. A fluid distribution unit is mounted to one or more of microgrooved surfaces of the heat transfer member.

The fluid distribution unit includes a system of fluid feed channels and fluid exiting channels which extend through the fluid distribution unit in fluid communication with the microgrooves of the heat transfer member. A heat exchanging medium is fed through a plurality of fluid inlets formed in the fluid distribution unit to flow through the feed channels to the microgrooves of the heat transfer member and exit from the fluid distribution unit through a plurality of fluid outlets in vapor or liquid form, thereby removing heat from the heat generating surface.

The heat transfer member may have microgrooves formed at two opposite surfaces thereof. Two double-sided microgrooved heat transfer members may be arranged in parallel to sandwich the fluid distribution unit therebetween.

Alternatively, the heat transfer member may be implemented as a three-dimensional unit having a plurality of microgrooved surfaces with a fluid distribution unit mounted to each of these microgrooved heat transfer surfaces.

In a multi-sided heat transfer member, the microgrooves formed on one surface may extend in angled relationship to the microgrooves formed on another surface, wherein the angle between the directions of the microgrooves on different surfaces may range between approximately 0 and 90 degrees.

In the fluid distribution unit, primary feed channels may extend in parallel one relative to the other. There also may be a system of auxiliary feed channels extending in transversely to primary feed channels to improve the heat transfer efficacy of the device.

The heat exchanging device of the present invention may include a plurality of heat exchanging modules attached to a plurality of heat generating objects, a microchannel based condenser coupled to the plurality of fluid outlets of the fluid distribution units, and a pump connected between an output of the microchannel based condenser and the plurality of fluid inlets formed on the fluid distributing units of the plurality of heat exchanging modules.

Such a device may include a plurality of operation modes, including single phase convection, thin film evaporation, and forced feed boiling. For thin film evaporation, little if any pumping power is used. For single phase convection and forced feed boiling operational modes, high pumping power is preferably provided in controlled manner.

In single phase convection, the cooling medium (fluid) does not change its phase during the cooling procedure, while in the thin film evaporation and forced feed boiling modes, the working fluid entering the fluid inlets evaporates at the microgrooves and exits from the fluid distributing unit in vapor form.

The heat transfer surfaces may include, in addition to or instead of the microgrooves, a plurality of micropins.

A heat exchanging device formed with a pair of double sided microgrooved heat transfer surfaces and a fluid distributing unit sandwiched therebetween, preferably includes a plurality of fluid entering channels and fluid exiting channels having different respective widths, depending on the required temperature range, cooling capacity, and the fluid used. For example, in a two phase heat exchanging device, in which vapor is produced during the cooling process, the fluid exiting channels may be formed with greater width than the fluid entering channels.

These and other features and advantages of the present invention will become clearer from further description of the preferred embodiments of the device of the present invention in conjunction with the drawings.

PREFERRED EMBODIMENT OF THE PRESENT INVENTION

Figure 1:
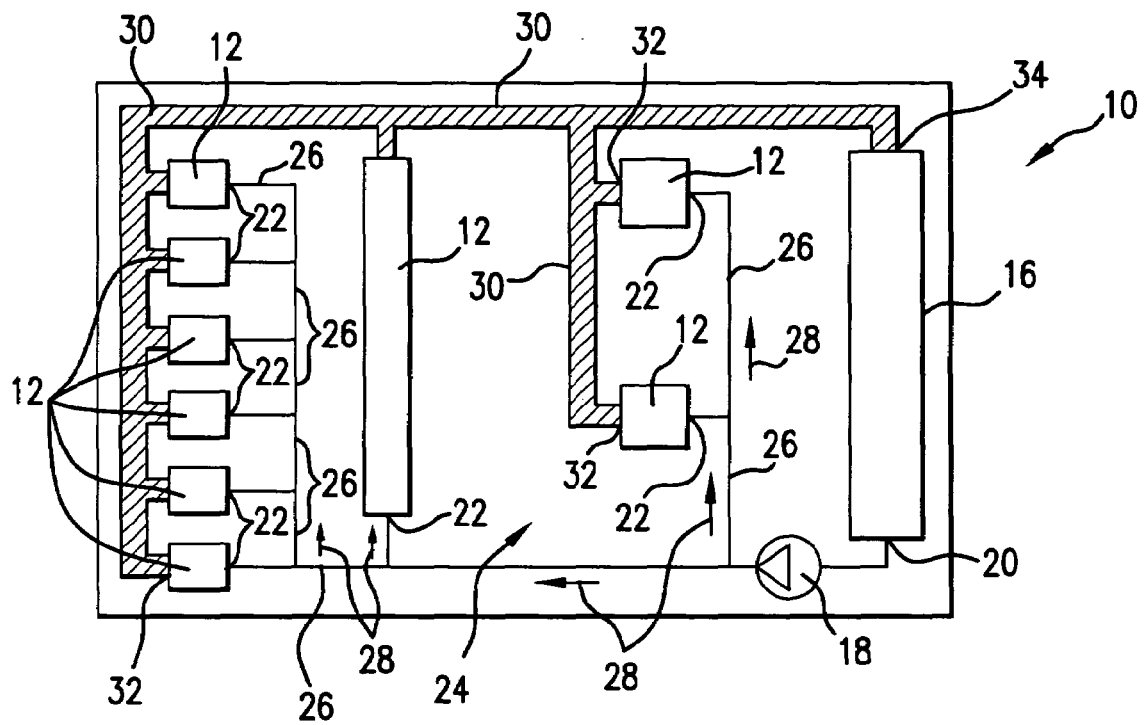
FIG. 1 is a schematic diagram illustrating a self-contained heat exchanging device of one embodiment of the present invention.

Referring to FIG. 1, a cooling system 10 includes a plurality of heat exchanging modules 12 attached to a heat generating object 14 (best shown in FIG. 2), a microchannel condenser 16, and a pump 18 connected between an output 20 of the microchannel condenser 16 and inlets 22 of the heat exchanging modules 12. A system 24 includes supply tubing 26 for supplying cold heat exchange medium 28 to the inlets 22 of the heat exchanging modules 12 and tubing 30 for removing the heated fluid medium 28 from outputs 32 of the heat exchanging module 12 to the microchannel condenser 16.

The cooling system 10 is preferably operable in either one-phase or two-phase mode of operation, as described in further paragraphs. The cooling system 10 is preferably implemented as a self-contained hermetic system which may be contained in a housing (not shown) for being attached as a whole to an object which generates heat, such as, for example, high powered phased arrays, radars, and the like. System 10 may be employed for cooling electronics in a wide range of high flux military or commercial electronics applications.

Implementing the cooling system of the present invention as a self-contained hermetic module mountable to a heat generating object realizes immediate benefits like significantly increasing the heat dissipation capacity for the heat generating object without requiring liquid connection between the heat generating object and the cooling system. If the requirements of the intended application permit, of course, a single heat exchanging module 12 may be connected in certain other embodiments with a microchannel condenser through the pump and tubing system 24 for circulating the heat exchange medium 28.

Figure 2:
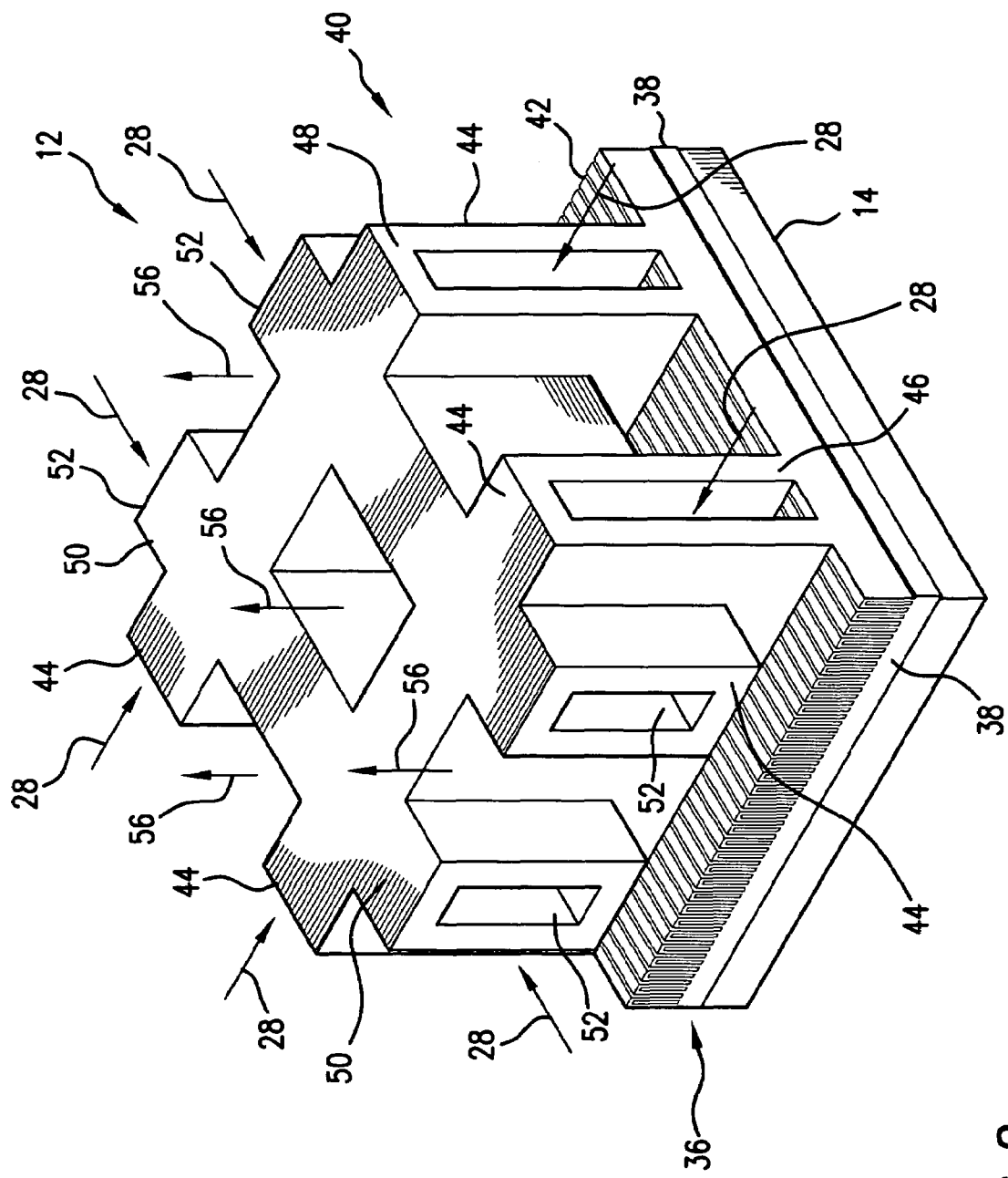
FIG. 2 is a perspective representation of a forced-fed boiling/evaporative heat exchanging device of one embodiment of the present invention in the modular form.

Illustrated in FIG. 2 is a heat exchanging module 12 formed in accordance with an exemplary embodiment of the present invention. Module 12 in this embodiment includes a heat transfer member 36 which is directly attached to the heat generating object 14 by its substrate 38. A fluid distribution unit 40 is mounted to the heat transfer member 36. The heat transfer member 36 has a micropatterned surface where a plurality of microgrooves 42 are formed in the substrate 38 at predetermined depths by micromachining, etching, or any other suitable process known in the art.

The fluid distribution unit 40 has feed channels 44 extending preferably in parallel one relative to the other, each with spaces formed between the walls 46 thereof. Each channel 44 has a top portion 48 where the walls 46 terminate. The bottom of each channel 44 is disposed in fluid communication with the microgrooves 42 (which may alternatively be formed as micropins) so that the heat exchange medium 28 when received through the inlets 22 of the fluid feed channel 44 has immediate access to the open tops of the microstructures, or microgrooves 42, of the heat transfer member 36.

The fluid feed channels 44 of the fluid distribution unit 40 are preferably through not necessarily connected by one or more cross bars 50 defining their own cross channels 52 to serve as auxiliary fluid channels. The cross bars 50 substantially reinforce the fluid distribution unit 40, helping maintain its structural integrity.

Figure 3:
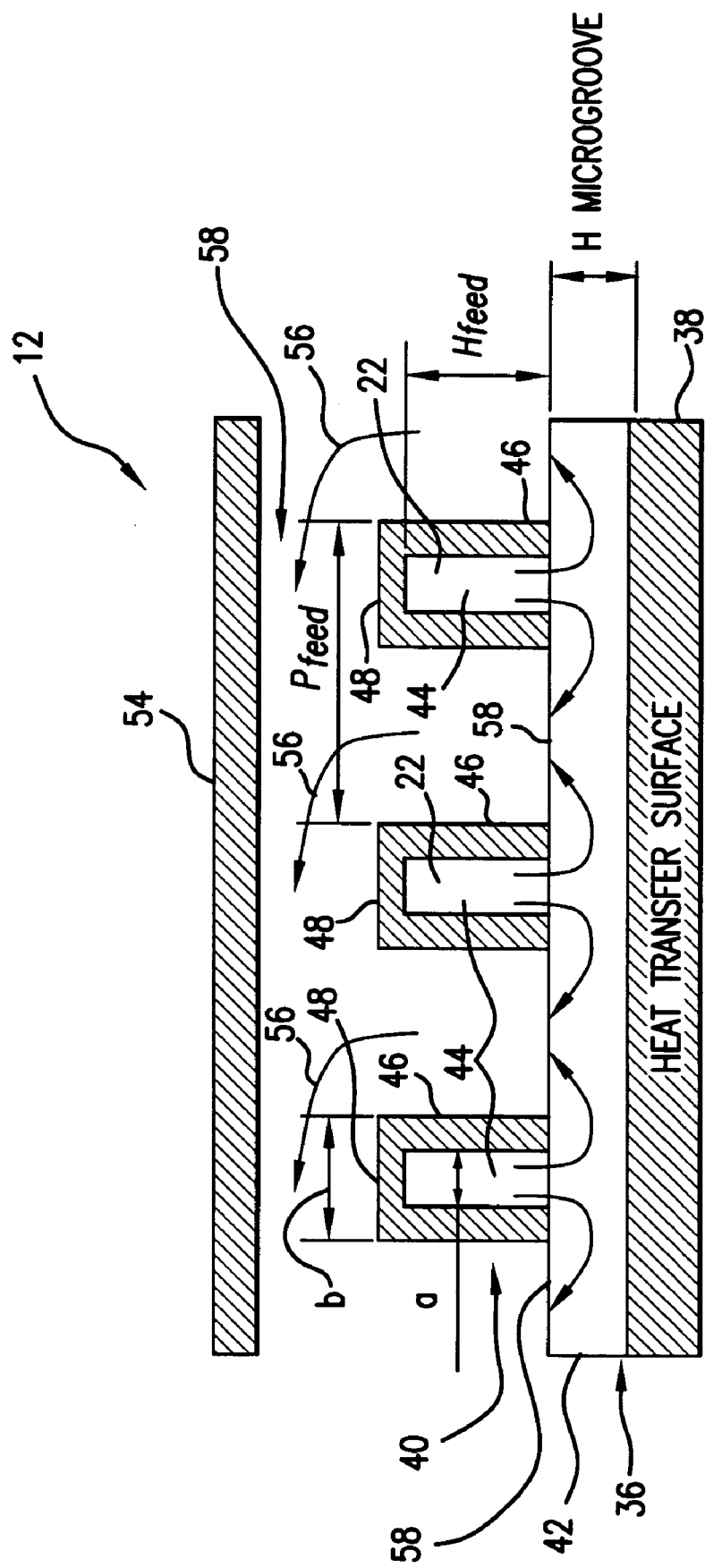
FIG. 3 is a sectional view of a modular heat exchanging device of FIG. 2.

The heat exchanging module 12, as best illustrated in FIG. 3, preferably also includes a top lid 54 which extends above the top portions 48 of the fluid feed channels 44 and auxiliary channels 52. The top lid 54 is coupled in hermetically sealed manner connected to the heat transfer member 36 at its respective edges (not shown) to form a self-contained and hermetically sealed cooling system in modular implementation ready to be mounted to a heat generating object.

As best shown in FIGS. 2 and 3, the feed channels 40 and cross bars 50 are preferably spaced apart over the heat transfer member 36 in order to allow vapor flow 56 escape from the surface of the heat transfer member 36. A plurality of vapor releasing channels 58 are thus formed between the feed channels 44, 52, and between the top portions 48 of the feed channels 44 and 52 and the top lid 54.

The feed channels 44 are configured to guide heat exchange medium 28 to the microgrooved evaporative surfaces of the heat transfer member 36 in an effective fashion. A properly configured forced heat evaporative structure 12 (heat exchanging module) operated independently of gravity and may therefore be placed upon a heat generating object in any orientation. The heat exchange medium 28 is thus supplied to the microgrooved heat transfer surface 36 through a network of fluid feed channels 44 and auxiliary channels 52 of the fluid distribution unit 40. Absent any particular requirement of the intended application, there are no physical restraints to limit feed channel dimension; therefore, the pressure drop of the feed channels may be accordingly minimized and the heat exchanging medium distributed evenly over the surface of the heat transfer member 36.

The incoming fluid medium 28, either in liquid or gaseous form, flows along the tops of the microgrooves 42 to provide convective cooling at the surface of the heat transfer member 36. Then, as the fluid is forced into the microgrooves 42, it cools further by convection until the fluid eventually reaches saturation temperature and boiling/evaporation begins.

Preferably, at least three operational modes are provided for the heat exchanging device of the present invention. In one mode, single-phase convection is effected where the heat capacity is low enough to require just single-phase cooling. The pumping pressure generated by the pump 18 to force the fluid to circulate in the tubing system 24 towards the inlets 22 of the heat exchanging module 12 overcomes the pressure drop of the fluid in the microgrooves and feed channels. Heat transfer in the single-phase convection mode occurs purely by convective cooling, and the microgroove surface operates as a single-phase microchannel heat sink.

In a second mode, thin film evaporation effected, where capillary pressure in the microgroove must be high enough for the corresponding saturation temperature expected along the microgrooves or micropins. The required pumping pressure is lower than the capillary pressure, but higher than the pressure drop in the microgrooves. The heat transfer surface (the surface of the microgroove) preferably operates in a self-controlled thin film evaporative mode. This is an optimum operation mode for the cooling system of the present invention.

The upper surfaces of microgrooves may be coated with a suitable material not wettable with the working fluid. For example, such material may be hydrophobic coating if water is used as the working fluid. The coating creates an upward meniscus in the microgrooves when no heat is applied and the pump is in operation. This prevents liquid overflow and keeps the pumping power at a minimum.

In a third mode of operation, forced-fed boiling is effected, where the capillary pressure of the microgrooves and liquid sub-cooling are sufficiently conducive to liquid boiling in the microgrooves. Depending on the heat dissipation rate, surface orientation, the selected microgrooves, and feed channel dimensions, as well as pumping pressure magnitude, the resulting heat transfer may occur through either pool boiling or forced-fed boiling, or through a combination of both.

The heat exchanging module 12 of the present invention has a well developed system of feed channels and auxiliary channels 42, 52 and open areas (vapor releasing channels) 58 for vapor circulation. When operating in the single-phase mode, the preferred characteristics of the module are similar to those of a microchannel heat sink with a much lower pressure drop/pumping power requirement. In fact, the size of the microgrooves can be significantly reduced in comparison with microchannels operating at similar conditions, thus increasing the heat transfer coefficient as well as the heat transfer area. The thermal resistance of such a heat sink is lower than the thermal resistance of conventional single-phase microchannel heat sinks and requires much less pumping power.

When operating in the forced-feed boiling mode, the system performs at a much higher heat flux compared to known pool boiling approaches in which the liquid supply is limited by the capillary action of the boiling structure. Inherently, the pumping power requirements for forced-feed boiling are lower than for convective boiling.

In the thin film evaporative mode, forced-feed evaporation provides a combination of high heat transfer coefficients of a thin film evaporation with extended heat transfer area. This extended heat transfer area for the microgrooved surface may be twenty or more times greater than nominal surface areas typically used for thin film evaporation. The additional surface area provided by carefully configured microgrooved (or micropinned) structure helps to overcome certain performance limitations of conventional smooth thin film evaporative surfaces.

The surface temperature uniformity of the heat exchanging device 12 shown in FIGS. 2 and 3, operated in the forced-fed boiling evaporation mode, is superior to other known cooling structures. For example, a heat exchanging device formed in accordance with the present invention exhibits advantages over spray cooling heat sinks, in which the evaporating rate is usually 25%-30% and the non-uniformity of temperature over the heat sink surface reaches 17° C. and higher due to the limited amount of injectors over a given area. With optimum selection of evaporative channel dimensions, a heat exchanging device of the present invention operated in the thin film mode exhibits the heat transfer coefficient substantially as a function of the conduction through the fluid in the microgrooves: $h \approx k/d$, where k is a thermal conductivity of the fluid and d is a maximum film thickness in the channel, or half of the channel width. The nominal surface area heat transfer coefficient also depends on the microgrooves' aspect ratio and grooved surface effectiveness.

In the thin film evaporative mode, the local heat transfer coefficient tends to be higher due to film thickness being lower than a half channel width. However, a nominal surface area heat transfer coefficient may be leveled by a partially effected microgrooved area.

Figure 4:
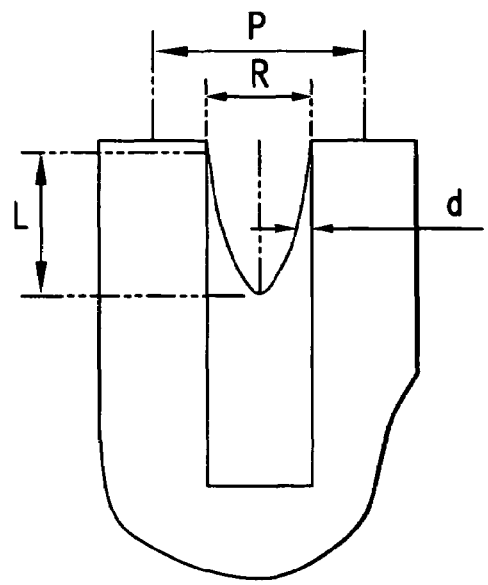
FIG. 4 shows is an enlarged scale sectional view of a microgroove formed in one embodiment of the present invention, shown in a thin film evaporative mode of operation.

FIG. 4 demonstrates the thin film evaporative mode in the microgrooves. The thin film evaporative mode may be the most attractive for a self-contained cooling system. It requires a liquid flow rate some two orders of magnitude lower than with single-phase microchannel cooling, and a required pumping power which is negligible when compared to state of the art alternative cooling technologies. In FIG. 4, P represents microgroove (or micropin) pitch; L represents meniscus height; b represents average film thickness; and R represents groove width.

The forced feed evaporator of the present invention has significant advantages over capillary pump loops and loop heat pipes. The capillary-driven cooling loops help to prevent vapor generation in the liquid lines. This vapor generation can break the capillary barrier and render the loop inoperable. Therefore, known capillary driven loops resort to using low thermal conductivity capillary structures to prevent heat conduction into the liquid line. Polyethylene wicks are commonly used in capillary pump loops, and stainless steel wicks in loop heat pipes. Liquid transported to the heated surface by the capillary action of the wick evaporates in the capillary structures. The generated vapor enters into the grooves micromachined in the capillary structure or in the heated surface. Therefore, the low thermal conductivity of the evaporative structure (wick) and partial contact between the wick and the heated surface significantly increase thermal resistance of capillary loops and limit the maximum dissipated heat flux. In addition, a thermal contact resistance between the heated surface and the evaporative-wick-structure usually occurs, which also limits heat dissipation.

In the forced feed evaporative structure of the present invention, the evaporative structure is an extension of the heated surface and is fabricated from a high thermal conductivity material such as copper, for example. Thus, hardly any thermal contact resistance results between the heat generating object and the evaporative surface of the heat transfer member 36. The evaporative structure 12 effectively acts as an extended surface of the heat generating object's surface without increasing heat dissipation. The micromachined (microgrooved) evaporative surfaces used in accordance with the present invention typically provide actual heat transfer areas more than twenty times greater than the nominal area to be cooled. The developed heat transfer area becomes effectively a part of the heated surface of the heat generating object. High evaporative heat transfer coefficients and high effectiveness of the heat transfer area fabricated from high thermal conductivity material provide thermal resistances significantly lower than in capillary driven loops.

heat sink and a forced feed evaporative heat sink formed in accordance with one embodiment of the present invention. A microfabricated Si heat sink was diffuse bonded to an SiC dye, while the SiC dye thickness was reduced from 380 to 250 μm. The high heat transfer coefficient in the microfabricated heat sink of the present invention along with the direct bonding allow significant reduction in semiconductor temperature beyond those achieved with the copper microchannel heat sink.

Table 1 provides a summary of comparisons between a forced-fed evaporator formed in accordance with an embodiment of the present invention and certain other known technologies. As seen in Table 1, the forced-fed evaporator of the present invention offers a clear advantage, in terms of reduced thermal resistance (highest heat transfer coefficient), required flow rates, and pumping power.

TABLE 1

Comparison of Exemplary Performance Characteristics

| Technology & Mode | | Working Fluid | Working Temperature Range (C.°) | Maximum Heat Flux (W/m2) | Thermal Resistance (Km2/W) | Required flow for 2 kW Cooling (kg/s) | Pumping Power for 2 kW cooling (W) |
|---|---|---|---|---|---|---|---|
| Liquid Cooling | Micro-Channels | Water + Antifreeze | −40 to 100 | $10^7$ | $5 \times 10^{-6}$ | 0.16 | 11.5 |
| | Powder Metal | Water + Antifreeze | −40 to 100 | $2.5 \times 10^6$ | $1 \times 10^{-5}$ | 0.2 | 22 |
| | Forced-Feed Structure | Water + Antifreeze | −40 to 100 | $10^7$ | $4 \times 10^{-6}$ | 0.14 | 3.52 |
| Two Phase Cooling | Heat Pipes | Water | 40 to 180 | $5 \times 10^5$ | $2 \times 10^{-5}$ Wm2/K | $0.81 \times 10^{-3}$ | N/A |
| | Capillary Loops | Ammonia | −50 to 80 | $1 \times 10^6$ | $3.5 \times 10^{-5}$ | $1.7 \times 10^{-3}$ | N/A |
| | Spray Cooling | Ammonia | −50 to 80 | $7 \times 10^6$ | $5.8 \times 10^{-6}$ | $4.1 \times 10^{-3}$ + 0.089 L/s of vapor | 9.45 |
| | Forced-Feed Evaporation | HFE 7100 | −80 Test to Predict 100 | $3.5 \times 10^6$ $5.0 \times 10^6$ | $9.5 \times 10^{-6}$ $5 \times 10^{-6}$ | 0.0164 0.0164 | 0.05 0.015 |
| | | Ammonia | −50 to 80 | $1 \times 10^7$ | $4 \times 10^{-6}$ | $1.7 \times 10^{-3}$ | 0.006 |

The maximum heat flux in the forced-feed evaporative structures of the present invention is only limited by the amount of the supplied fluid. The external feed channels potentially provide a virtually unlimited capacity to supply cooling to the evaporative structure shown in FIGS. 2 and 3. The maximum heat flux attainable in a device formed in accordance with the present invention is expected to be at least two order of magnitude higher than that attainable with conventional capillary driven loops.

The thin film evaporative mode of operation is the desired mode and the present invention provides this operational regime by adjusting certain parameters accordingly. For instance, highly efficient system of operation may be realized by use of a microgrooved surface having the microgroove widths of about 20 μm or less in combination with a high surface tension working fluid.

Forced feed boiling mode evaporation is the most easily achievable mode as it does not require flow control or significant sub-cooling. Liquid flow is intermediate to that in the single-phase and thin film evaporating cooling modes. This mode is designed to be the preferable operational mode for the maximum heat dissipation rate conditions.

Figure 5A:
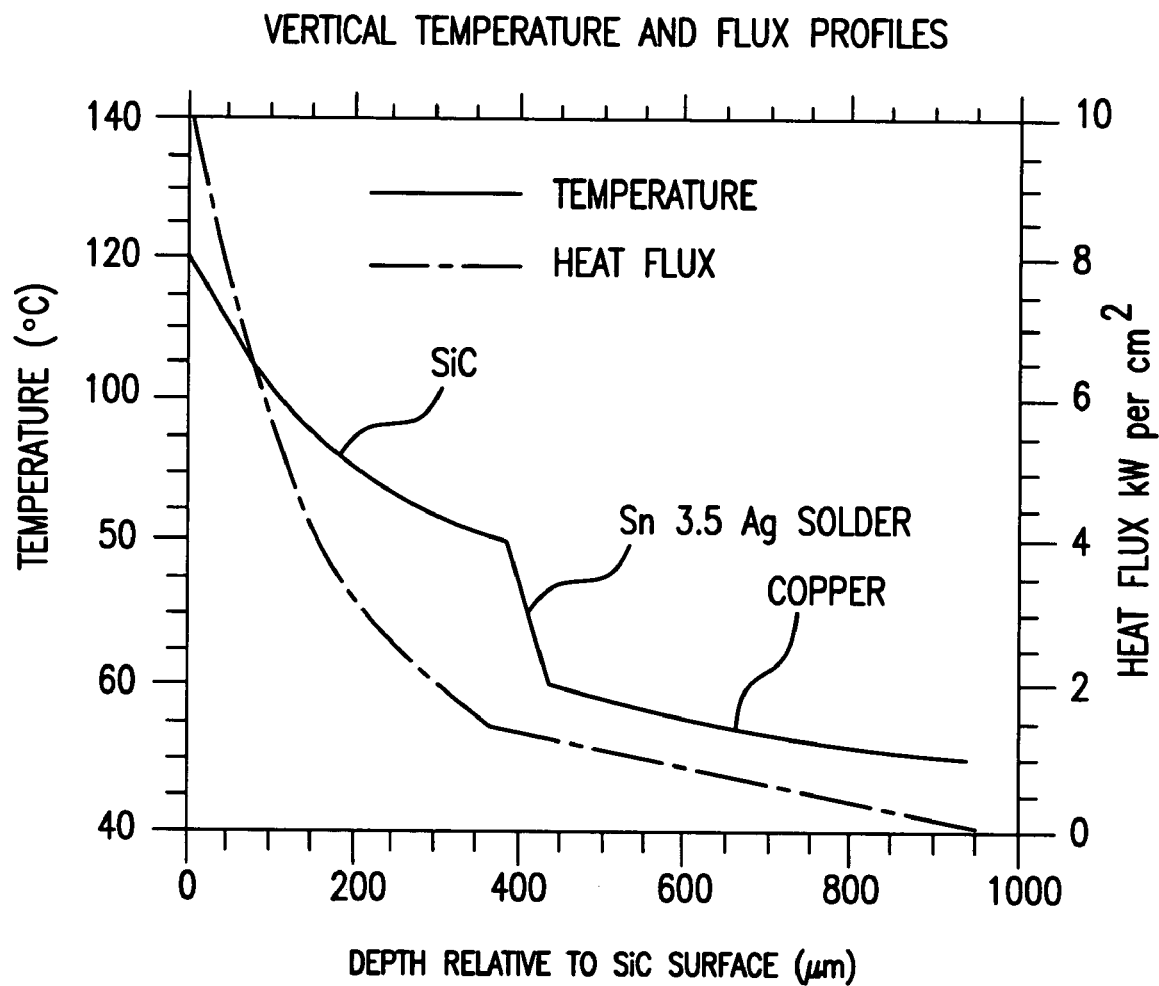
FIGS. 5A and 5B are diagrams representing vertical temperature profiles over various microgroove depths for a conventional copper microchannel heat sink (FIG. 5A) and a forced fed evaporative heat sink formed in accordance with one embodiment of the present invention (FIG. 5B)
Figure 5B:
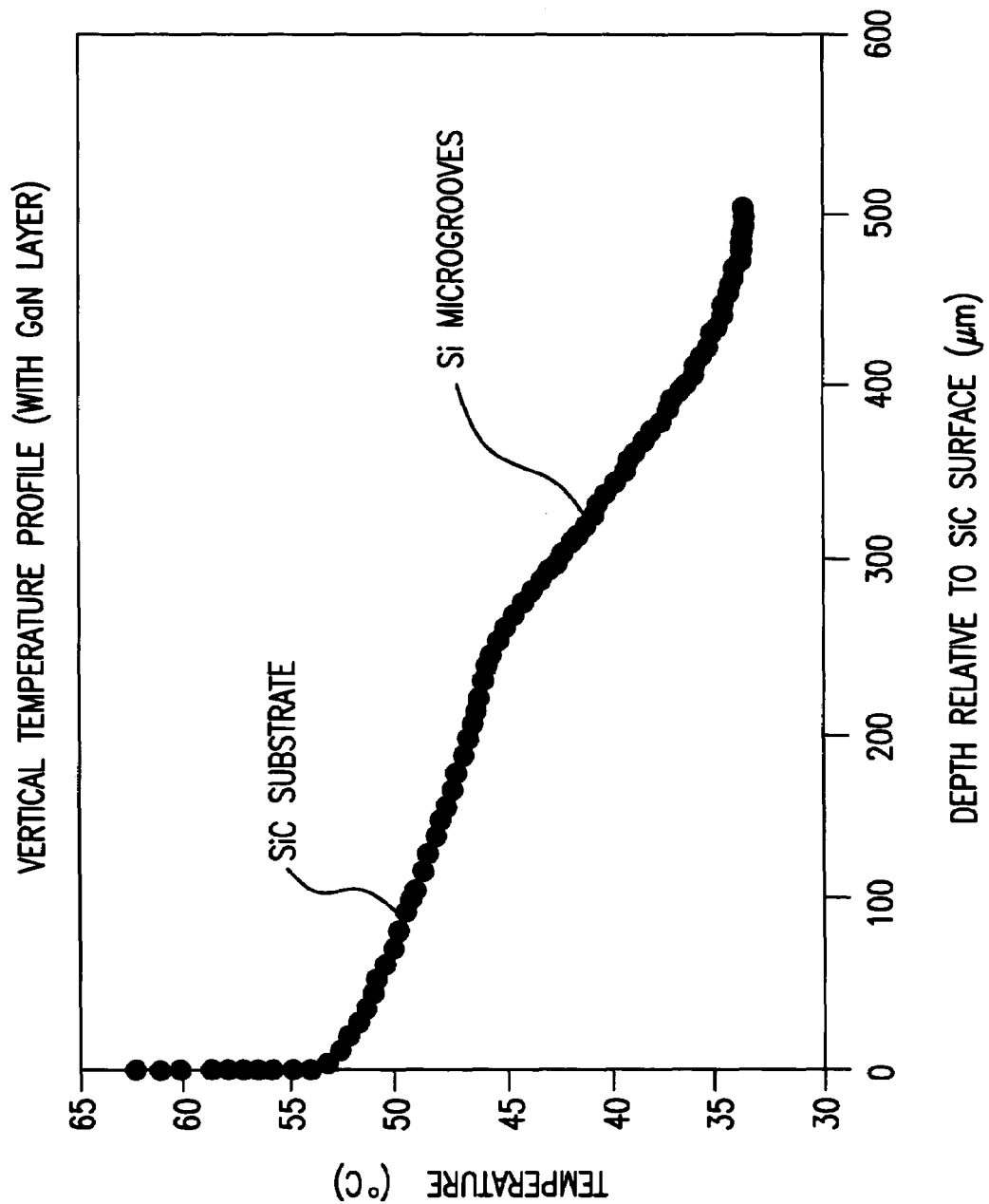

FIGS. 5A and 5B demonstrate empirical comparisons of performance between a conventional copper microchannel The modules shown in FIGS. 2 and 3 have been tested in pool boiling and forced fed evaporation modes of operation. In the forced-fed evaporative mode, the devices were tested in horizontal positions submerged in liquid and vertically in partially submerged positions. HFE 7100 fluid was used as the working fluid. When compared to data with pool boiling, the heat dissipation rate of the forced feed evaporation device increased from 45 W/cm$^2$ for pool boiling to 350 W/cm$^2$ for forced-fed evaporation, and the nominal area heat transfer coefficient increased from 40,000 W/m$^2$-K to 105,000 W/m$^2$-K respectively. Moreover, the forced-fed structure demonstrated its independence from positional orientation.

Referring again to FIG. 1, the forced-fed boiling/evaporative heat sinks 12 of the present invention are positioned corresponding to heat sources of the electronics to be cooled. Heat exchanging modules 12 may also be positioned any other suitable manner relative to the given heat source. The positioning of the heat exchanging modules 12 in the self-contained cooling system 10 of the present invention may be effected to suitably replicate the circuitry to be cooled. The particular dimensions and configuration of the self-contained cooling system 10 will be determined in accordance with the requirements of the intended application.

The microchannel condenser 16 of FIG. 1 is preferably designed to provide minimum thermal resistance with minimum pressure drop. In certain exemplary embodiments, the microchannel condenser 16 is preferably formed with a hydraulic diameter of channels less than 500 µm. The applications of a condenser so configured combines maximal performance with compactness for the integrated heat sink.

The thin film evaporative mode of operation is a preferred operational mode of the self-contained cooling system 10 as it requires minimum fluid circulation and moderate pumping pressure. To provide reliable operation over extended service life, the self-contained cooling system 10 is hermetically sealed. The pump may have a magnetically driven impeller encapsulated in the cooling system 10. Also, electro-hydro-dynamics (EHD), piezoelectric pumps and osmoses may be employed in certain other embodiments of the cooling system of the present invention.

The microgrooved surfaces with channel widths of 20 µm or lower are preferred (though not necessary) for the heat exchanging module 12 of the present invention. The microgrooved surface for the forced feed evaporator and microchannel condenser may be produced from aluminum or any other material of suitably comparable properties known in the art. It is preferable particularly for certain applications having strict weight restrictions such as for space and various other aerospace applications. Additional benefits of aluminum other than weight include the large selection of commercially available extruded aluminum microchannels for the condenser and aluminum's compatibility with ammonia as the working fluid.

Use of ammonia as a working fluid offers the advantage of higher viscosity and heat of operation over hydra-carbon or fluoro-carbon fluids. The use of ammonia may also facilitate an increase in the heat capacity of the heat sink and a reduction in the required pumping power.

For the reduction of thermal stresses in the cooling system package 10 of the present invention, the coefficient of thermal expansion (CTE) for the heat sink should be close to the CTE of the material to which the cooling system package is attached for cooling. The thermal expansion of a copper microgrooved structure may be restricted by using CuMo alloys with desirable CTE match bonded on the surface of the structure. This bonding may be performed prior to the fabrication of the structure. Cost effective fabrication of microgrooved surfaces from CuMo alloys may make this a desirable approach in fabricating a cooling system package of the present invention. The CTE of the aluminum evaporator 12 may be restricted by a layer of AlSiC or other such suitable composite deposited thereon.

The required microgrooved surface of the heat transfer member 36 may be easily produced in silicon by microfabrication technology. The CTE of Si matches the CTE of SiC used as a base dye for many electronic applications, and bonding technology for bonding Si heat sink to a SiC semiconductor is well established. As it creates an almost perfect match with minimum thermal resistance, this combination may provide minimum thermal stresses while yielding very high performance when employed in a heat transfer member formed in accordance with the present invention. The SiC/Si package has definite thermal advantages over other material combinations.

Alternatively, both microgrooves and feed channels may be microfabricated in Si wafers. Thus, a suitable Si to Si bonding technique is used for mounting the fluid distribution unit to the microgrooved surface.

The microchannel condenser 16 may be fabricated from silicon with triangular microgrooves approximately 0.33 mm wide and 0.2 mm deep or from copper having rectangular microchannels of approximate size 0.45 mm×0.25 mm. The 2 KW heat dissipation from the heat generating object by the cooling system of the present invention accordingly formed exceeds capabilities of comparable technologies known in the art.

It is considered that the heat flux generated at the heat sink of the present invention will typically be on the order of 250 kW/m$^2$. Such a level of heat flux requires the nominal area heat transfer coefficient in the condenser to be in the range of 100,000 W/m$^2$K. A microchannel condenser 16 with microgrooves similar to those used in the heat exchanging modules 12 may be used under those conditions. To minimize the pressure drop, the length of the condenser would be minimized to approximately 10-20 mm.

The working fluids selected for operation with the heat exchanging module 12 of the present invention significantly affect the performance of the self-contained heat sink of the present invention. The most acceptable fluids include water, ammonia, R134A, HFE 7100, toluene, alcohol, as well as air. The present invention is not limited to a particular choice of working fluid, however, as such choice will depend largely on such criteria as safety, reliability, materials compatibility, performance, and operational conditions.

Returning to FIGS. 2 and 3, the height of the cross bars 50 may be selected depending on the fabrication technique used for manufacturing the heat exchanging module 12. For example, if the fluid distribution unit 40 is fabricated by a single operation chemical etching, the heights of the cross bars 50 may be similar to the thicknesses of the upper wall (top portion) 48 of the fluid feed channel 44. If an ion etching or electro-erosion (for metal distribution unit) is used, the cross bars 50 may have heights different from the wall thicknesses of the fluid feed channels. It is desired to provide cross channels 52 inside the cross bars 50. The auxiliary channels 52 optimize liquid distribution in the fluid feed channel 44, decrease liquid pressure drop, and increase temperature uniformity of the substrate 38 of the heat transfer member 36 under non-uniform heat flux. It is clear that the fabrication of the auxiliary channels 52 is complex as it requires double-side etching and additional bonding. Therefore, the provision of the auxiliary channel 52, although it is desirable, is not necessary. Their inclusion will depend on the requirements and available resources of the intended application.

The fluid distribution unit 40 is preferably attached to the upper surface of the microgroove 42 by bonding or compressing to the micromachined surface of the heat transfer member 36. Other suitable techniques known in the art may also be employed in this regard.

The heat exchanging modules 12 operate generally as follows. The working fluid 28 is supplied to the inlets 22 from the tubing system 24, and through the channels 44 of the fluid distribution unit 40, onto the upper surface of the heat transfer member 36. The working fluid enters in the microgrooves 42. Depending on the application and fabrication technology, the widths of the microchannels (microgrooves) may range approximately from 3 to 1000 µm. The optimum widths of the microgrooves should provide sufficient capillary pressure to compensate for the super heat of the walls (fins) of the microchannel surface and to suppress boiling on the bottom of the microchannels, which would expel liquid from the microchannels. The widths of the microgrooves should be less at the bottom of the microchannel to provide higher capillary pressure in the area corresponding to the hottest part of the walls (fins).

Fluid is distributed in the microgrooves 42 under pressure and/or capillary action of the microgrooves and evaporates.

Vapor condenses in the condenser 16 and is supplied back to the fluid distribution unit 40 by the pump 18 or by capillary action of the microgrooves. If the system operates as a capillary loop, it is desirable to sub-cool liquid before it enters the channels 44 (and/or auxiliary channel 52) to prevent vapor formation in the channels 44 and 52. The distances between the channels 44 as well as between channels 52, are selected to provide sufficient liquid supply and minimize pressure drop in the microgrooves 42. The openings (channel inlets and outlets) formed in the fluid distribution unit 40 allow vapor flow with minimum pressure drop.

The configuration presented in FIG. 2 is suitable for a flat heat generating object. The same principles may be applied to heat exchanging modules 12 having other configurations as, for example, a cylindrical one to correspond to the particular shape of the given heat generating object to be cooled.

In comparison with pool boiling, the heat exchanging module 12 of the present invention provides an optimized liquid/vapor movement and compensation for pressure drop in the microgrooves that allows significant increase in dissipation of the heat flux. In comparison with convection boiling, the module of the present invention provides for a much greater area for vapor flow with much shorter channel lengths, thus minimizing pressure drop and required pumping power by orders of magnitude compared to that for conventional convection boiling heat transfer. Compared to the capillary loop evaporation, the heat exchanging device of the present invention optimized geometry for capillary structure and achieves maximum pumping pressure with minimum pressure drop.

The three-dimensional evaporative structure of the present invention also has advantages over the microfabricated conventional capillary evaporative loop, in providing a controllable capillary dimension with minimal microgrooves lengths. Liquid may thus be supplied to the capillary structure at a high liquid flow with minimum pressure drop. As a result, the power range of the loops is extended from just a few watts to several kW.

The heat exchanging device of the present invention may be operated in a passive capillary mode without employing a pump, or operated at a much higher heat flux by providing additional fluid through an external source of pumping pressure.

Samples of copper microgrooved surfaces were tested in pool boiling mode. The samples also were equipped with the fluid distribution unit 40 and tested in forced-fed mode. The test results demonstrated a capability to approximately ten times increase the critical heat flux in comparison with the pool boiling mode of operation.

Figure 6:
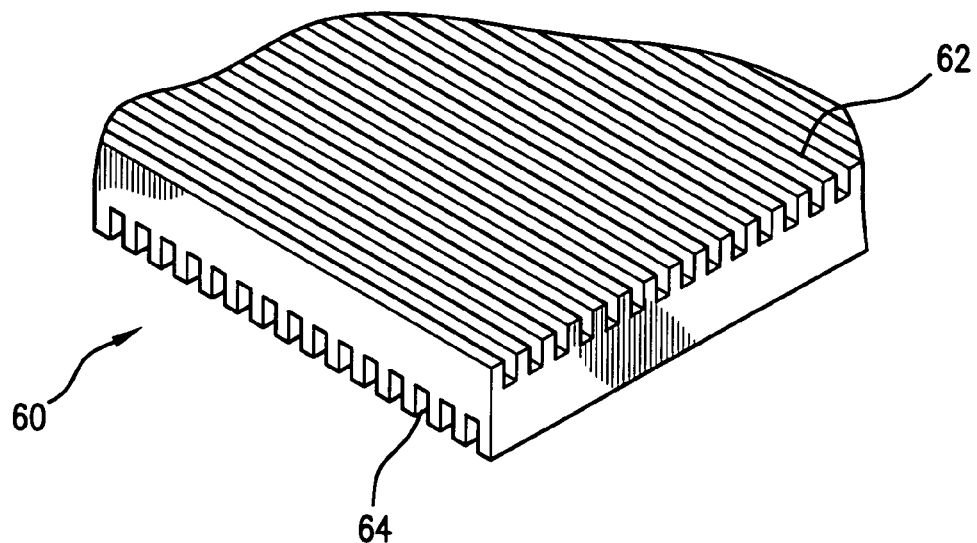
FIG. 6 is a perspective view, partially cut away, of a double-sided microgrooved heat transfer surface formed in accordance with one embodiment of the present invention.
Figure 7:
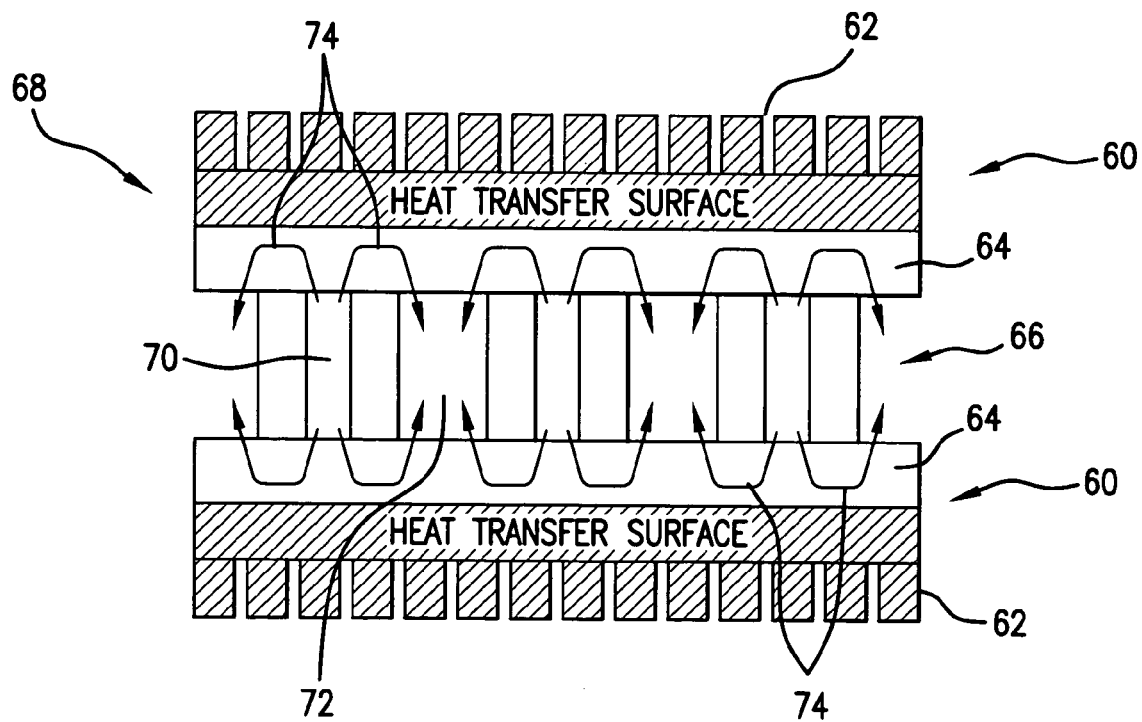
FIG. 7 is a schematic diagram illustrating a segment of a microgrooved surface heat exchanger in accordance with an alternative embodiment of the present invention.
Figure 8:
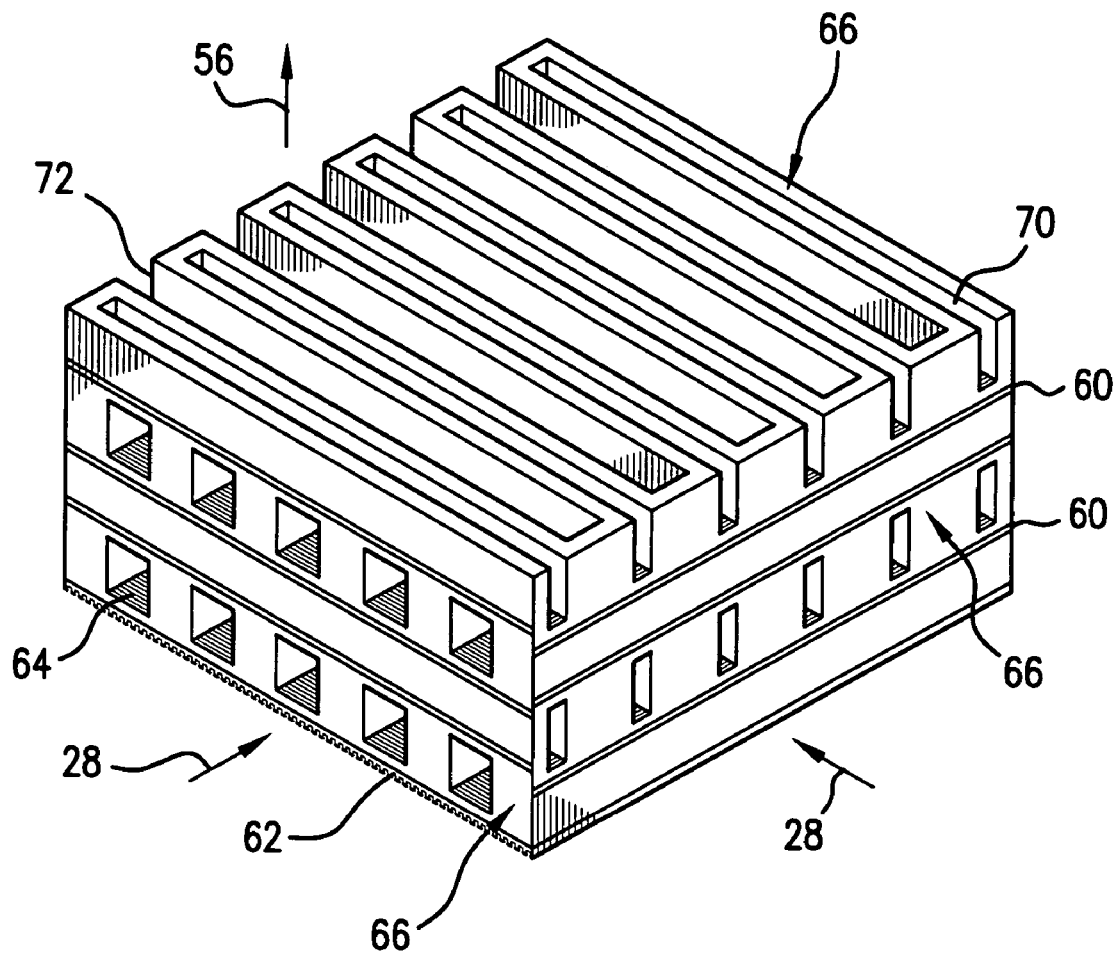
FIG. 8 is a perspective view of a microgrooved heat exchanging device of another alternate embodiment of the present invention which combines double-sided microgrooved surfaces intermittently stacked with a system of fluid distribution units.

In a further embodiment of the heat exchanging module of the present invention shown in FIGS. 6-8, a double-sided microgrooved heat transfer member 60 is used which has microgrooves 62 on one side thereof and microgrooves 64 formed on the opposite side. In the particular example illustrated, the microgrooves 62 and 64 formed on the opposite sides of the heat transfer member 60 extend perpendicularly in relative orientation. However, in accordance with the present invention, the angular offset between the sets of microgrooves 62 and 64 may vary from 0° to about 90°, depending on the flow arrangement and the dimensions of the flow distributing channels of the corresponding fluid distribution unit 40. Microstructures 62 and 64 formed on different sides of the heat transfer member may be similar or substantially different, e.g. they may differ in dimension, the microstructures at one side they may comprise microgrooves, while at the other side comprise micropins.

A fluid distribution unit 66 having feed channels and outlet channels formed thereon is sandwiched between a pair of double-sided heat transfer members 60 as best shown in FIGS. 7 and 8. A heat exchanging module 68, as best shown in FIG. 7, then includes a pair of double-sided heat transfer members 60 and the fluid distribution unit 66 sandwiched therebetween. In operation, a working fluid is supplied to the feed channels 70, passes through the microgrooves 64 to exit through the output channels 72, as shown by arrows 74. It is seen that the working fluid circulates between two microgrooved plates (heat transfer member) 60. The microgrooves 64 on opposing sides of the flow distributor (fluid distribution unit) 66 are directed in parallel in the plane of the sectional view of FIG. 7, while the flow distribution channels—both feed channels 70 and output channels 72—are shown crossing the plane of FIG. 7.

Two sets of channels, the feed channel 70 and the output channel 72, serve to transport working fluid either in the same phase, or in different phases, depending on the mode of operation of the module. For example, if the module is operated either in the thin film evaporation or force-feed boiling modes of operation, where vapor is created during cooling in the microgrooves, the output channels 72 are formed wider to accommodate the increased volume of the vapor phase of the working fluid. In the single phase convection mode of operation, where no change of phase of the working fluid takes place, the output channels 72 may be the same in dimension as the feed channels 70.

The same structure shown in FIGS. 6-8 may be used also for the microcondenser 16 best shown in FIG. 1. The output channels of the microcondenser in that embodiment may be made smaller than the feed channels, as the working fluid typically enters the microcondenser in a vapor phase and exits in a liquid phase.

One of the most significant advantages of the microgrooved surface heat exchanger over the conventional plate-and-fin heat exchanger is that in the microgrooved surface heat exchanger of the present invention, most of the heat transfer area is concentrated on the microgrooved plates 60. The heat transfer coefficient in the microgrooves is also significantly higher than on the fins or flow distribution channels due to lesser hydraulic diameters of the microgrooves. Therefore, most of the heat transfer from fluid to fluid (from incoming fluid to the outgoing fluid) occurs in the microgrooves themselves. Heat transfer through the walls between the feed channels 70 and the output channels 72 are often negligible due to the significantly low heat transfer area and heat transfer coefficient.

As a result, most of the heat transfer takes place locally in the double-sided heat transfer surface 60. A few hundred microns of high thermally conducted material, separating hot and cold areas will not create a significant temperature difference on the outside of the double-sided microgrooved heat transfer surface. While double-sided heat transfer surface will have some intermediate temperature gradient between temperatures of the cold and hot fluids, the temperature gradient will remain almost constant over the heat exchanger. In the module shown in FIG. 7, fluid flow direction does not effect operation of the device.

Referring now to FIG. 8, there is shown a stacked arrangement of modules of the type illustrated in FIG. 7. In this arrangement, the double-sided heat transfer members 60 and the fluid distribution units 66 are alternately interposed in the stack. Such a stacked arrangement thus includes a plurality of double-sided heat transfer members 60, each consecutive pair sandwiching a fluid distribution units 66 therebetween. Fluid distribution units 66 on the different sides of heat transfer member may be substantially different. For example, they may differ in dimension, size of feed channels, as well as wall shapes. In the example shown in FIG. 8, the channels 70 and 72 of the upper fluid distribution unit 66 are shown opened for ease of understanding. These channels will be covered up on full assembly either by another double-sided heat transfer member 60 or by an upper lid to form a self-contained heat exchanging device of the present invention. The channels of the fluid distribution unit 66 may be easily fabricated using, for example, photolithography, etching, or another other suitable technique known in the art.

In the configuration presented in FIGS. 6-8, the practically constant temperature of the heat transfer surface between hot and cold fluids within the fluid distribution unit 66 allows for modifications of structural parameters and material selections for the heat exchanger body and flow distribution channels to effect significant reduction in the heat exchanging device's thermal cycling fatigue and increase in its service life and reliability.

TABLE 2

Characteristics of the Exemplary Microgrooved Surfaces Tested

| Sample | FPI | Fin Pitch (mm) | Fin Height (mm) | Channel Width (mm) | Channels Aspect Ratio (height/width) | Fin Thickness (mm) |
|---|---|---|---|---|---|---|
| 9 | 100 | 0.254 | 0.456 | 0.084 | 5.5 | 0.169 |
| 10 | 100 | 0.254 | 0.660 | 0.084 | 8 | 0.169 |
| 11 | 100 | 0.254 | 0.889 | 0.084 | 10.6 | 0.169 |
| 12 | 143 | 0.178 | 0.406 | 0.059 | 7 | 0.118 |
| 13 | 143 | 0.178 | 0.610 | 0.059 | 10 | 0.118 |
| 14 | 143 | 0.178 | 0.838 | 0.059 | 14 | 0.118 |
| 15 | 200 | 0.127 | 0.228 | 0.042 | 5.5 | 0.085 |
| 16 | 200 | 0.127 | 0.406 | 0.042 | 9.7 | 0.085 |
| 17 | 200 | 0.127 | 0.483 | 0.042 | 11.5 | 0.085 |

Table 2 summarizes certain characteristics of the microgrooved surfaces ere tested.

Figure 9:
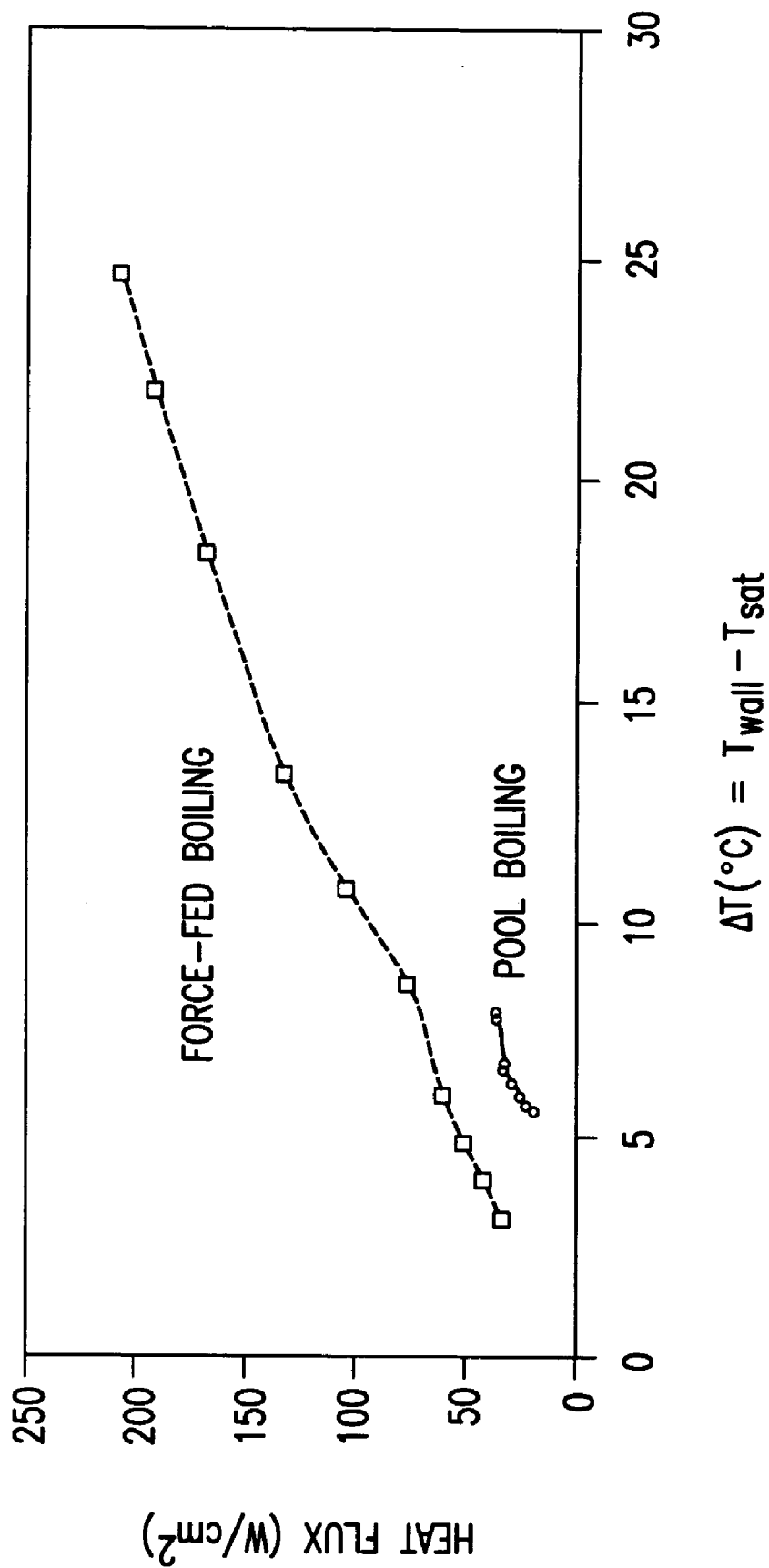
FIG. 9 is a diagram representing heat flux vs. temperature characteristic for a boiling process in a conventional heat exchanger and a heat exchanging device formed in accordance with one embodiment of the present invention.

A comparison of a two-phased forced-fed boiling device with a conventional pool boiling heat exchanger is shown in the diagram of FIG. 9 which illustrates the relationship between the observed heat flux and temperature gradient.

Figure 10:
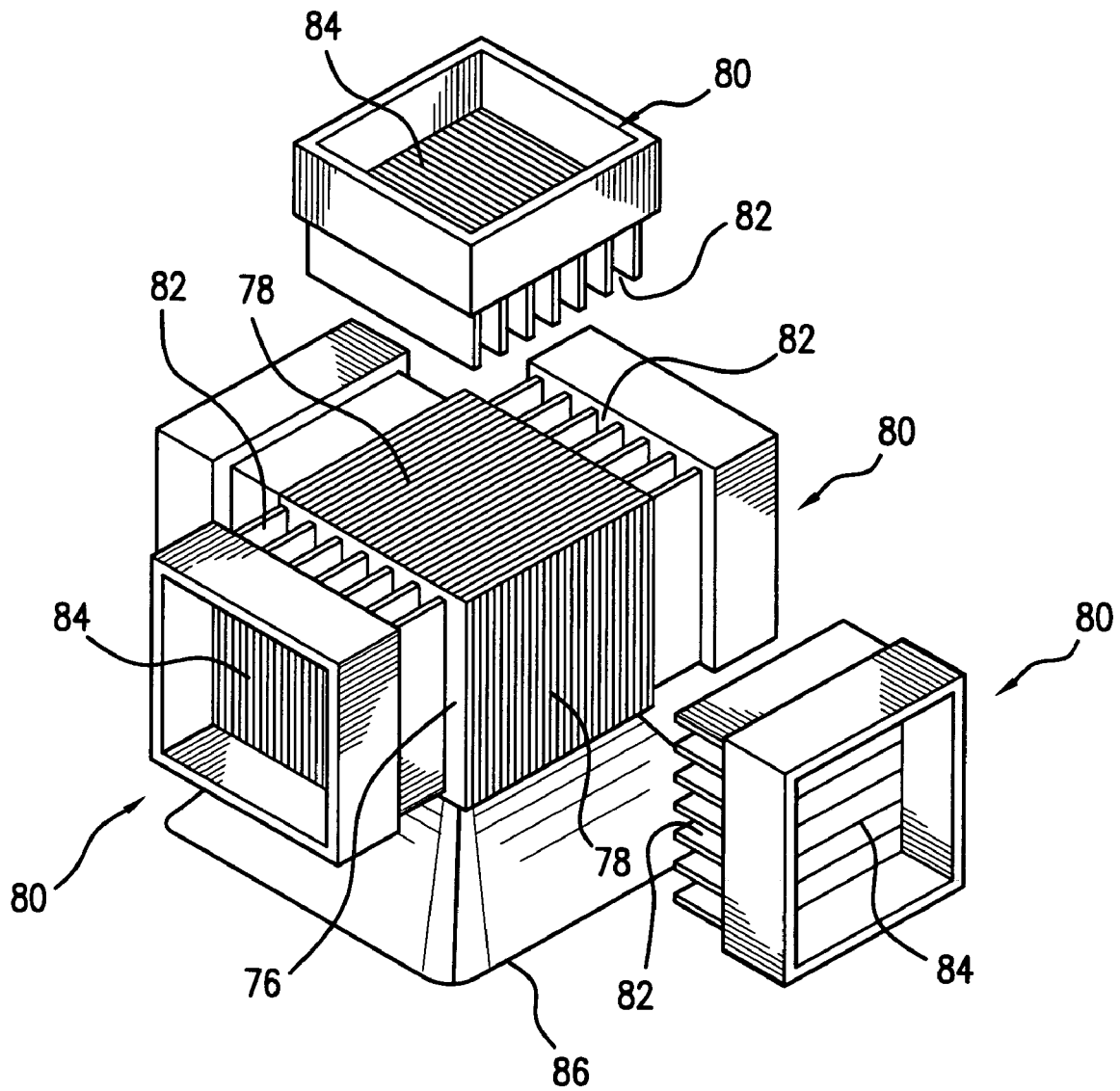
FIG. 10 is a partially exploded perspective view of a three-dimensional heat exchanging device formed in accordance with yet another alternate embodiment of the present invention.

Shown in FIG. 10 is still another alternate embodiment of the heat exchanging device of the present invention in which a three-dimensional heat transfer member 76 is provided with a plurality of micropatterned surfaces 78 each formed with an array of parallel extending microgrooves or rows of micropins. Each micropatterned surface 78 has associated therewith a fluid distribution unit 80 where the feed channels 82 are formed. The fluid addition unit 80 similar to the unit shown in FIGS. 2 and 3, having in addition to the feed channels 82, output channels 84 through which the vapor or heated working fluid exits the heat exchanging device. The three-dimensional heat transfer member 76 may be mounted as shown to a power infrastructure 86 to cool the latter.

In any embodiment thereof, the principles of the present invention allow for reduction of pressure drop in microgrooved heat exchanging device, and highly effective heat transfer. This is achieved by connection in parallel of a plurality of short microgrooves, and arrangement of microgroove surfaces with the fluid distribution units in stacked manner. As a result, the active length of a single microgroove is kept minimal while the total area of fluid passage considerably heightened. This results in reducing the pressure drop by orders of magnitude compared to conventional microchannel heat sinks of comparable size. The microgrooves, or micropins, formed in accordance with various embodiments of the present invention are accessible to working fluid from above the microstructures. The fluid is preferably supplied through a well-developed system of feed channels located at the top of the microgrooved (or micropinned) surface. The widths of the feed channels do not exceed twice the depths of the microgrooves (or micropins), while the widths of the microgroove walls is in the range of approximately 0.5 to 5 times the microgroove depth. The same stands true if the microgrooves are replaced (or combined) with rows of micropins. The widths of the microgroove channels (or the distance between micropins) preferably ranges from approximately 3 to 1000 μm, with the aspect ratio between the microchannel depths and widths ranging from approximately 1 to 50. The feed channels may be straight, or L or T shaped. The width of the feed channel may range approximately from approximately 0.5 to 10 times the microgrooves' depth. The tested microgroove (or micropin) based heat exchanging device of the present invention, demonstrates higher performance characteristics when compared with conventional heat exchanging devices of a similar nature.

Figure 11:
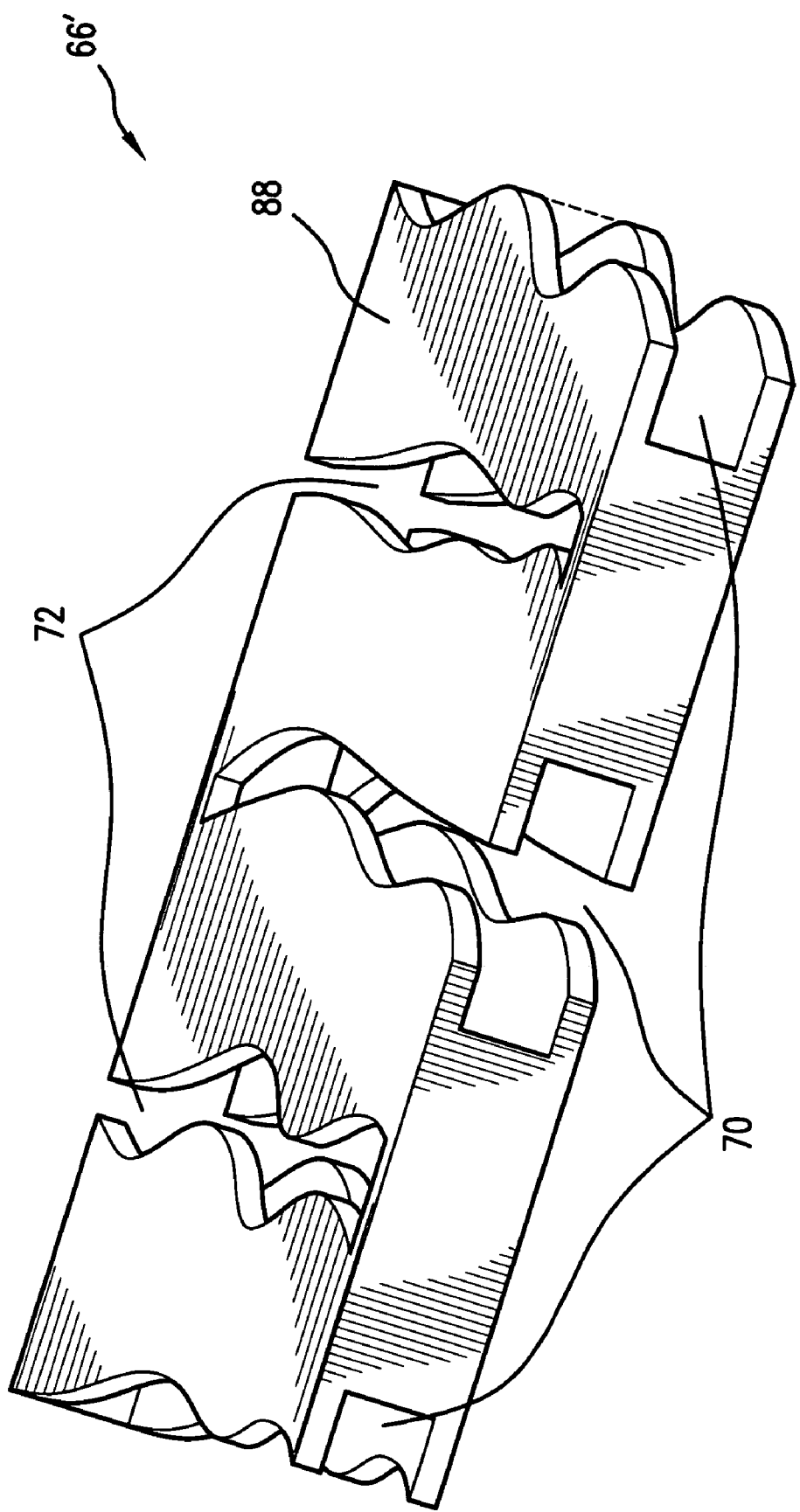
FIG. 11 is a perspective view of a portion of an H-shaped flow embodiment of a distribution unit of the present invention with feed channel walls of variable width; and, FIG. 12 are side elevational views of other alternate embodiments of the flow distribution unit of the present invention.
Figure 12:
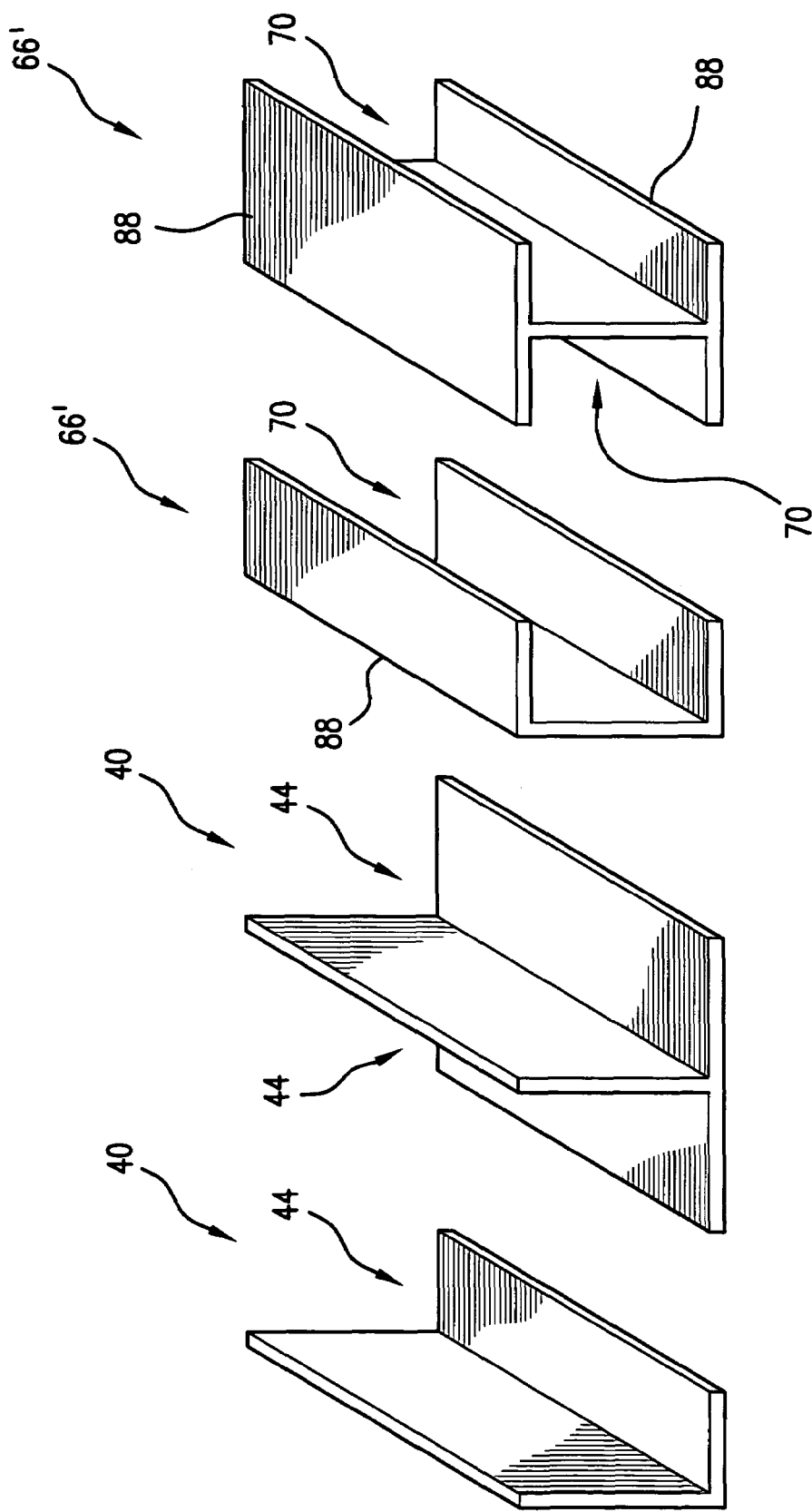

In the heat exchanging device of the present invention, the microgrooved surface is arranged into plurality of short microchannels connected in parallel. The lengths of the microchannels are determined by the widths of the walls of the feed channels in contact with microgrooved surface. If an extended length of the microchannels is needed to balance the lengths of the parallel microchannels and the total flow area to achieve desirable pressure drop and flow distribution through the microchannels, feed channels of L or T shape, as well as straight rectangular shape, may be used for a single-sided microgrooved surface heat exchanger. Correspondingly, if a double-sided heat transfer surface is used as shown in FIGS. 6-8, in addition to those previously listed, a C or H shaped fluid distribution unit 66' such as shown in FIG. 11 may be used. The walls 88 of the fluid distribution unit 66' may have a variable width to adjust a variety of parameters of the heat exchanging device, such as, for example, pressure drop, flow and temperature distribution, as well as thermal distribution.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular locations of the elements may be reversed or interposed, all without departing from the spirit or scope of the invention as defined in the appended claims.

What is claimed is:

1. A heat exchanging device or a heat generating object, comprising:
    at least one heat transfer member for thermal contact with the heat generating object, said heat transfer member including at least one micropatterned surface having a plurality of microgrooves formed thereon;
    a fluid distribution unit mounted to one said micropatterned surface of said at least one heat transfer member, said fluid distribution unit defining a plurality of fluid feed channels and fluid output channels, said fluid feed and output channels extending in fluid communication with at least a portion of said microgrooves formed on said micropatterned surface; and,
    a flow of a heat exchanging medium passing between said fluid distribution unit and said heat transfer member to migrate through said fluid feed channels, at least a portion of said micropatterned surface, and said fluid output channels, said heat exchanging medium thereby removing from said heat transfer member heat generated by said heat generating object.

2. The heat exchanging device of claim 1, wherein said at least one heat transfer member includes a plurality of micropatterned surfaces, said heat exchanging device comprising a plurality of said fluid distribution units, each of said fluid distribution units being mounted to one of said micropatterned surfaces.

3. The heat exchanging device of claim 1, wherein said fluid feed channels extend substantially in parallel one relative to the other.

4. The heat exchanging device of claim 1, further including a plurality of auxiliary feed channels formed in said fluid distribution unit and extending in fluid communication with at least a portion of said micropatterned surface, said auxiliary feed channels transversely extending relative to said plurality of fluid feed channels.

5. The heat exchanging device of claim 1, wherein each of said plurality of feed channels includes a top portion and a pair of walls extending between said top portion and said at least one micropatterned surface, said heat exchanging device further including a top plate extending over said top portions of said feed channels.

6. The heat exchanging device of claim 4, further comprising a plurality of crossbars connecting said feed channels and defining said plurality of auxiliary feed channels.

7. The heat exchanging device of claim 1, further comprising:
  a microchannel based condenser operably coupled by an input thereof to said plurality of fluid outlet channels, and
  a pump operably coupled between an output of said microchannel based condenser and said plurality of fluid feed channels.

8. The heat exchanging device of claim 1, having a mode of operation, selected from the group consisting of:
  single-phase convection,
  thin film evaporation, and
  forced-fed boiling,
  wherein said heat exchanging medium in said single-phase convection mode enters and exits said fluid distribution unit in the same phase, and wherein said heat exchanging medium in each of said thin film evaporation and forced-fed boiling modes enters and exits said fluid distribution unit in different phases.

9. The heat exchanging device of claim 1, wherein said heat exchanging medium is selected from the group consisting of: water, ammonia, R134a, HFE7100, toluene, alcohol, and air.

10. The heat exchanging device of claim 1, wherein said micropatterned surface includes an array of microgrooves, wherein said microgrooves each range in width dimension from approximately 3 to 1000 μm, each said microgroove defining a depth dimension ranging between approximately 1 and 50 times said width dimension, each said microgroove having wall thickness dimension in the range of approximately 0.5 to 5 times said width dimension, and wherein fluid feed channels have walls, each wall width dimension ranges approximately from 0.5 to 10 times said microgroove depth dimension.

11. The heat exchanging device of claim 1, wherein at least a portion of said micropatterned surface is coated with a material non-wettable by said heat exchanging medium.

12. A heat exchanging device for a heat generating surface comprising:
  a multi-sided heat exchanging module including at least one heat transfer member having at least a pair of micropatterned surfaces each including a plurality of microstructures formed thereon, each said micropatterned surface of said at least one heat transfer member being contoured for conforming thermal contact with the heat generating surface;
  a fluid distribution unit mounted to at least one of said micropatterned surfaces, said fluid distribution unit including a plurality of fluid feed channels and fluid output channels formed therein, said fluid feed and output channels being in fluid communication with said microstructures of said at least one heat transfer member; and,
  a heat exchanging medium flowing within said fluid distribution unit, said heat exchanging medium being guided through said fluid feed channels to said microstructures and said fluid output channels, thereby removing from said heat transfer member heat generated by the heat generating surface.

13. The heat exchanging device of claim 12, wherein said plurality of microstructures formed at each of said at least a pair of micropatterned surfaces includes a plurality of microgrooves extending substantially in parallel one relative to the other, said microgrooves formed at one of said at least a pair of micropatterned surfaces being angularly offset in orientation by a predetermined angle from said microgrooves formed at the other of said at least a pair of micropatterned surfaces, said predetermined angle ranging between approximately 0° and 90°.

* * * * *